(12) United States Patent
Kreit et al.

(10) Patent No.: US 9,753,273 B2
(45) Date of Patent: Sep. 5, 2017

(54) ELECTROFLUIDIC DISPLAY AND METHODS FOR MAKING

(71) Applicant: University Of Cincinnati, Cincinnati, OH (US)

(72) Inventors: Eric Kreit, Cincinnati, OH (US); John David Rudolph, Cincinnati, OH (US); Kenneth A. Dean, Phoenix, AZ (US)

(73) Assignee: University Of Cincinnati, Cincinnati, OH (US)

( * ) Notice: Subject to any disclaimer, the term of this patent is extended or adjusted under 35 U.S.C. 154(b) by 0 days.

(21) Appl. No.: 14/676,956

(22) Filed: Apr. 2, 2015

(65) Prior Publication Data
US 2015/0293347 A1 Oct. 15, 2015

Related U.S. Application Data

(60) Provisional application No. 61/979,183, filed on Apr. 14, 2014.

(51) Int. Cl.
| | |
|---|---|
| *G02B 26/00* | (2006.01) |
| *G02B 26/08* | (2006.01) |
| *G02F 1/29* | (2006.01) |
| *G02F 1/17* | (2006.01) |
| *B32B 37/18* | (2006.01) |
| *B32B 37/12* | (2006.01) |
| *B32B 38/00* | (2006.01) |
| *B32B 37/00* | (2006.01) |
| *G03F 7/24* | (2006.01) |

(52) U.S. Cl.
CPC ............ *G02B 26/005* (2013.01); *G02F 1/172* (2013.01); *B32B 37/003* (2013.01); *B32B 37/1292* (2013.01); *B32B 37/18* (2013.01); *B32B 38/0004* (2013.01); *B32B 2315/08* (2013.01); *B32B 2457/20* (2013.01); *G03F 7/24* (2013.01)

(58) Field of Classification Search
USPC ......................... 359/290–292, 295, 296, 298
See application file for complete search history.

(56) References Cited

U.S. PATENT DOCUMENTS

| | | | | |
|---|---|---|---|---|
| 2012/0038844 | A1* | 2/2012 | Choi ................... | G02F 1/13394 349/43 |
| 2012/0081777 | A1* | 4/2012 | Heikenfeld .......... | G02B 26/005 359/290 |
| 2012/0154886 | A1* | 6/2012 | Heikenfeld .......... | G02B 26/004 359/228 |

* cited by examiner

*Primary Examiner* — Brandi Thomas
(74) *Attorney, Agent, or Firm* — Wood Herron & Evans LLP

(57) ABSTRACT

A method for manufacturing a freestanding film having at least one population of through holes cumulatively totaling at least 1% of the film area, wherein the standard deviation of hole diameters is less than 25% and a thickness less than 25 micrometers, The film provides a carrier substrate, a photo-curable material, a release agent and deposits a photo-curable material on the substrate, selectively curing the material and leaving uncured material in the pattern of holes, dissolving away the uncured material and removing the cured material from the carrier. Methods and apparatus are described.

2 Claims, 10 Drawing Sheets

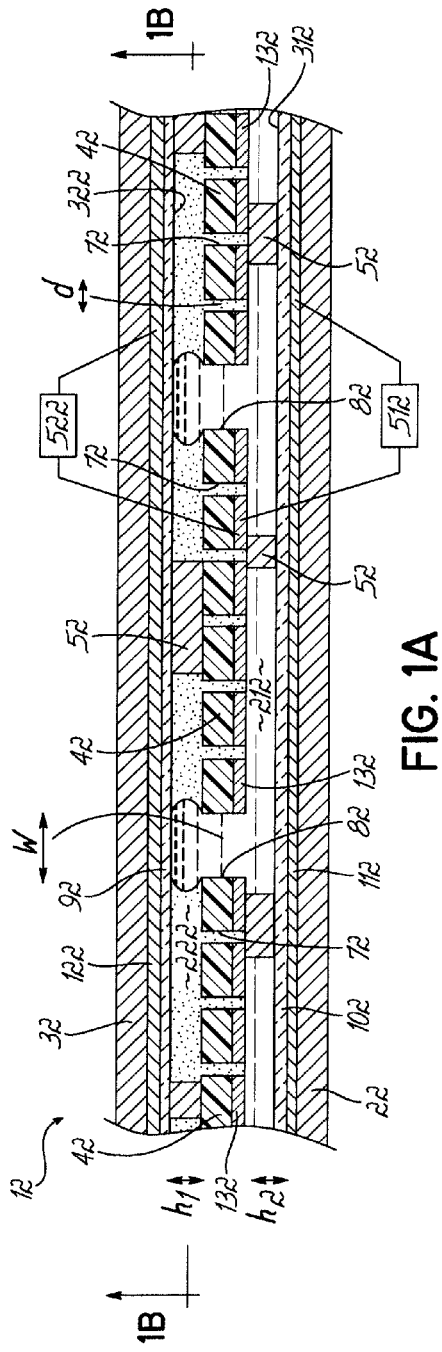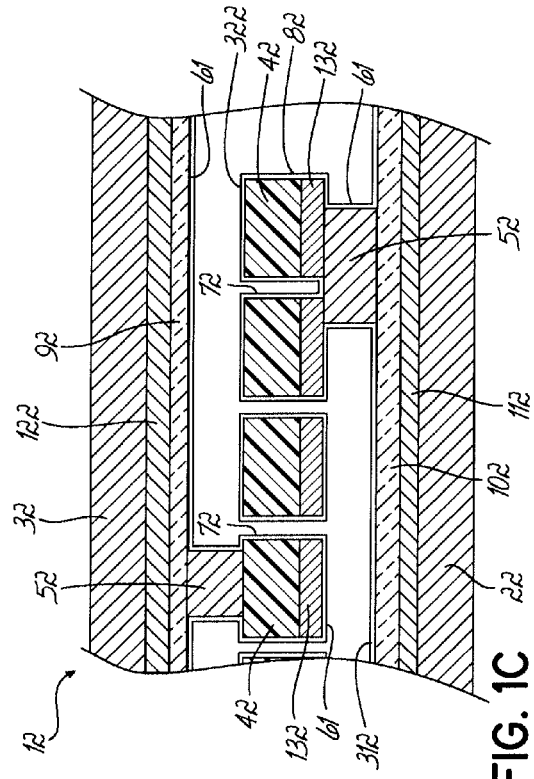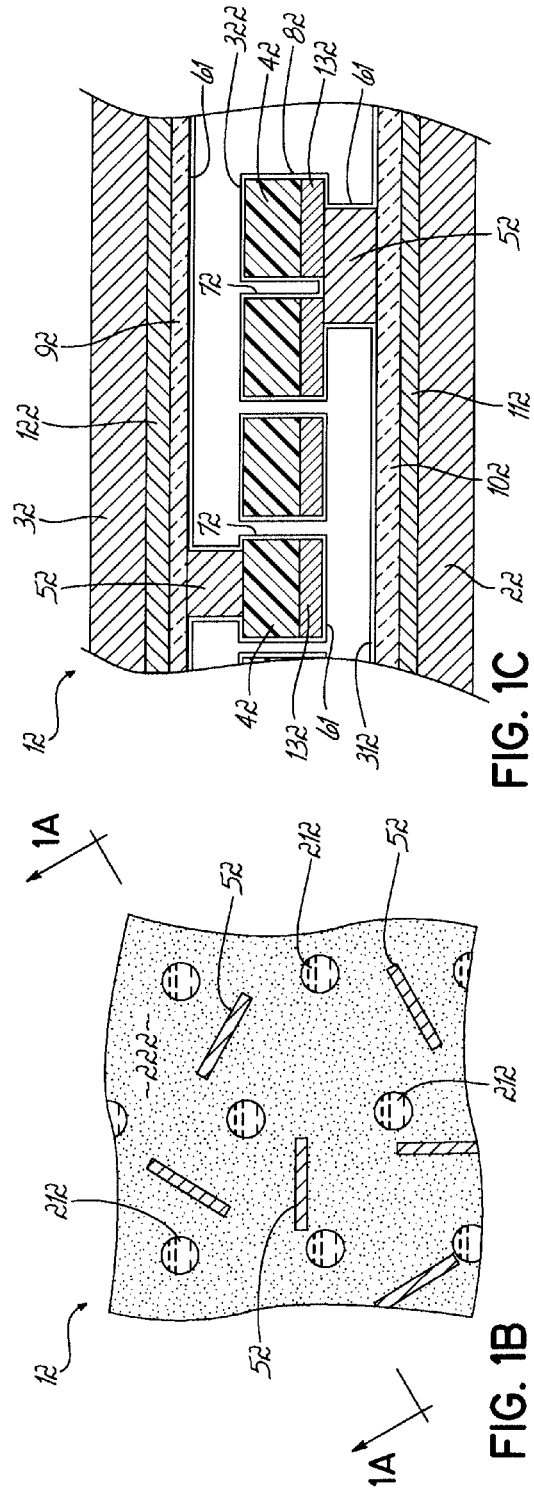
FIG. 1A
FIG. 1B
FIG. 1C

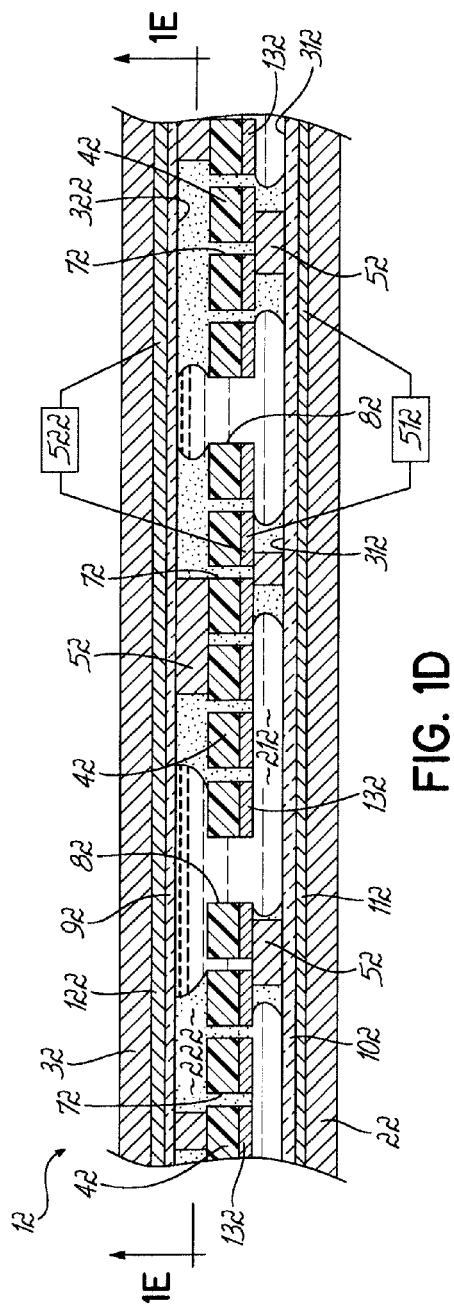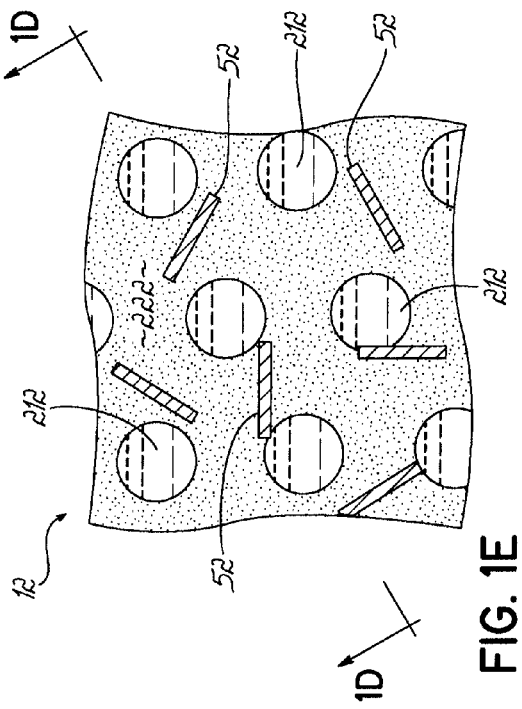
FIG. 1D
FIG. 1E

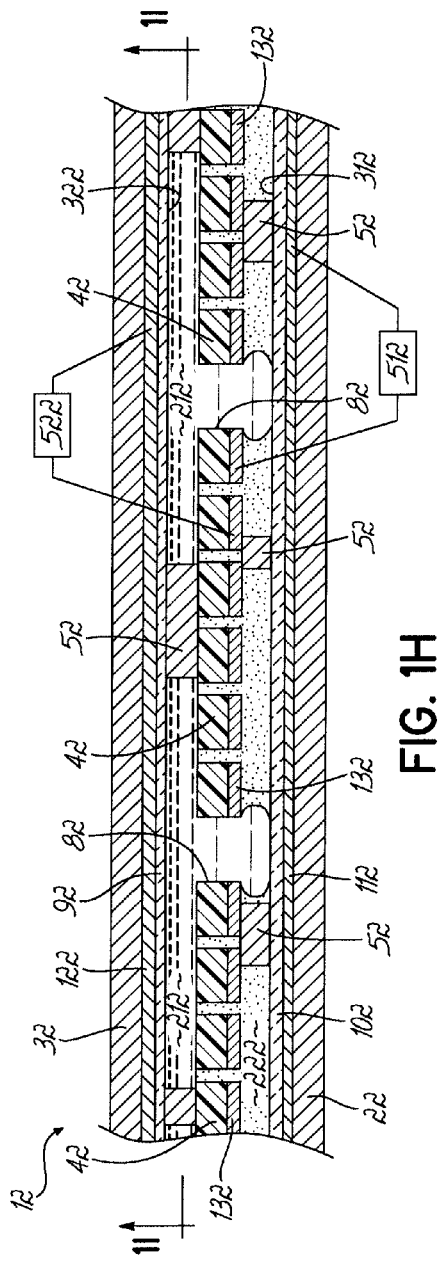
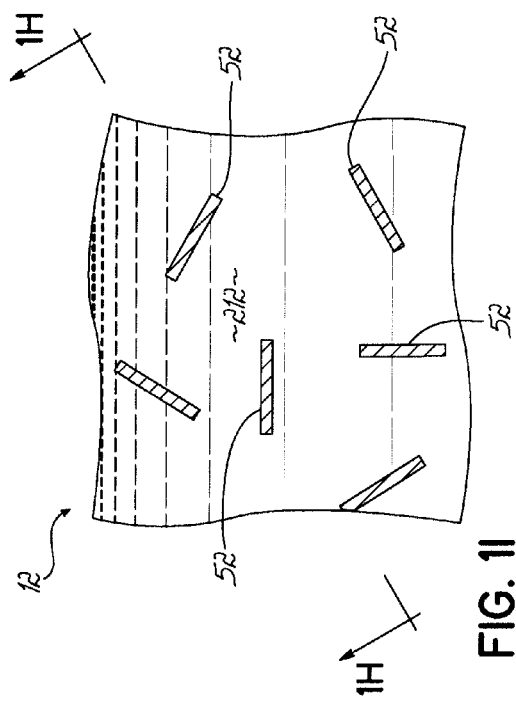

ELECTROFLUIDIC DISPLAY AND METHODS FOR MAKING

RELATED APPLICATION

The Present application claims priority to U.S. Ser. No. 61/979,183 filed Apr. 14, 2014, the disclosure of which is hereby incorporated herein by reference in its entirety.

GOVERNMENT RIGHTS

This invention may have been made with government support under contract 1058302 awarded by the National Science Foundation. The government may have certain rights in the invention.

BACKGROUND OF THE INVENTION

Reflective displays are commercially important in product areas that include electronic readers (e-Readers) and electronic shelf labels. They are paired with front-light systems to provide improving viewability for both bright and dark environments. However, current reflective displays lack the performance of color printing on paper. Electrofluidic displays (EFDs) can provide high brightness, large contrast, and vivid color in a reflective display while consuming no power to hold an image on the display. Due to its unbeatable color performance, electrofluidic displays provide a solution for future e-paper technology. Previous patent application publications, such as US2012/10081777, describe the structures that create reflective, front-lit, and emissive displays and devices, but do not include several methods for forming the display module and components thereof in a cost-effective, highly reliable, commercially-viable manner.

SUMMARY OF THE INVENTION

The present disclosure relates to methods for forming electrofluidic imaging films, displays or devices, and components thereof, that address the issues with conventional devices by reducing or eliminating the need for precise electrode alignment to a particular pixel, allowing for simple fabrication methods, and/or providing imaging or information display without the optical losses associated with pixel border features.

The invention will be further appreciated in light of the following detailed description and drawings, in which:

BRIEF DESCRIPTION OF THE DRAWINGS

FIG. 1A-1K are exemplary device structures and operating principles.

DETAILED DESCRIPTION OF THE INVENTION

Figure 1F:
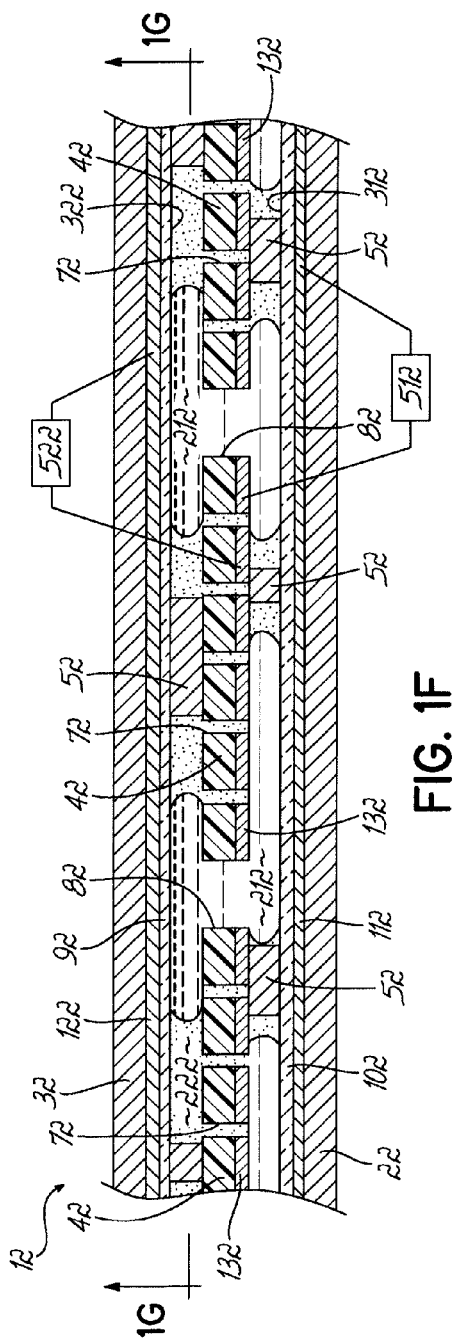

Although the present disclosure will be described in connection with certain embodiments, the description of the one or more embodiments is not intended to cover all alternatives, modifications, and equivalent arrangements as may be included within the spirit of the present disclosure. In particular, those of ordinary skill in the art will recognize that the components of the various electrofluidic devices described herein may be arranged in multiple different ways.

One or more embodiments of the present disclosure include an electromechanical force on a conductive polar fluid that is adjacent to an electrically insulated electrode. The electromechanical force originates near a line of contact between the conductive polar fluid and a dielectric layer that insulates the electrode. The electromechanical force is proportional to electrical capacitance times the square of a bias potential, or applied voltage. The electromechanical force is generally oriented such that it is directed outward from an exposed surface of the polar fluid. When the polar fluid is confined within a cavity or channel, the electromechanical force may be interpreted as a force per unit area or a pressure. Movement of fluid by the electromechanical force provides high-speed operation (on the order of milliseconds), low power capacitive operation (about 10 m~/m~), and excellent reversibility.

Other embodiments of the present disclosure may operate in accordance with alternative methods of moving fluids that are well-known by those of ordinary skill in the art of microfluidics. These alternate methods may include, but are not limited to, electrowetting without insulators, syringe-pumps, thermocapillary, photo-responsive molecules (such as spiropyrans), dielectrophoresis, electrophoresis, magnetic and electromagnetic forces, and micro-electro-mechanical pumping.

A Cartesian coordinate system may be used to define specific directions and orientations. References to terms such as "above," "upper," "below," and "lower" are for convenience of description only and represent only one possible frame of reference for describing a particular embodiment. The dimensions of the devices described herein may cover a wide range of sizes, from nanometers-to-meters, based on the particular use. Terms such as visible may be used in some cases to describe a person or machine vision system or other optical source or detector that is facing towards a particular surface of the device and that is capable of perceiving light emitted from the device and/or color system described herein.

Unless otherwise noted, the terms concave and convex refer to the geometry associated with the smallest radius of curvature along an exposed meniscus of the fluid. It is understood that other larger radii of curvatures on a meniscus may be oppositely concave or convex but will exhibit a weaker influence on the Laplace pressure of the meniscus. These additional radii are often not shown in the figures, but are readily understood in terms of their weaker influence on device design and operation.

The devices described in accordance with one or more embodiments of the present disclosure may also be useful for reflective, transmissive, and transflective displays. Therefore, light may transmit through or reflect from one or more surfaces of the devices. The devices may operate in a dual mode, i.e., transmissive and reflective at the same time, or switch between such modes of operation on demand. Backlights or other light sources may be incorporated and are also fully compatible with the devices described in accordance with one or more embodiments of the present disclosure herein. Light may be provided by a source that is positioned internal to the device, such as a backlight or a front-light, by a waveguide or other optics, or by the ambient surroundings such as sunlight or conventional light fixtures.

Any means of coupling a light source is applicable, including all techniques known by those skilled in the art of displays.

Turning now to the figures, and in particular to FIGS. 1A and 1B, a device 12 is constructed in accordance with one embodiment of the present disclosure. The device 12 includes a first substrate 22 and carries a first electrode 112, which is coated with an electrically-insulating dielectric layer 102.

The display 12 further includes a second substrate 32 with a second electrode 122, which may also include a dielectric layer 92.

The first and second substrates 22, 32 may be constructed from glass, plastic, metal foils, paper, textiles, sponges, or a variety of other materials that support construction of the device 12. The first and second electrodes 112, 122, as well as other electrodes as provided herein, may be constructed from a transparent solid material, such as indium oxide tin oxide ($In_2O_3$:$SnO_2$); a polymer, such as poly(3,4-ethylenedioxythiophene) poly(styrenesulfonate) (PEDOT:PSS); a reflective solid material, such as aluminum (Al); or a colored solid material, such as carbon black, so long as the electrode material provides suitable electrical conductance. Electrodes may alternatively be composites such as silver (Ag) nanowires in conducting polymer (e.g. Cambrios CLEAR-OHM conductive film (Sunnyvale, Calif.)).

The dielectrics layers 102, 92 may include any solid material which provides suitable electrical insulation. The dielectric layers 102, 92 may comprise an inorganic material, such as silicon nitride ($Si_3N_4$); an organic material, such as Parylene C; or a fluorinated material, such as Parylene F or HT; or mixtures, layers, and/or combinations thereof. The dielectric layers 102, 92 may have a thickness that ranges from about 1 nm to several 10s μm, resulting in operating voltages that range from between about 1 V and about 120 V, respectively. In some embodiments, no dielectric layer is required (commonly referred to as electrocapillarity). Solid surfaces or films may be inherently hydrophobic, or provided with an order of hydrophobicity by addition of a film or coating by plasma treatment, molecular mono-layer treatment, or other means. Fluoropolymers, such as Fluoropel (Cytonix, Beltsville, Md.,) and Cytop (Asahi, Chiyoda-ku, Tokyo), provide exemplary hydrophobicity. Additional solid materials, such as polyimide, which are not hydrophobic to polar fluids (such as water in a gas) may still be hydrophobic if the gas is replaced with a non-polar fluid having a surface tension that is similar to the solid material.

Generally, the term hydrophobic is used herein to describe a Young's wetting angle of greater than about 90 degrees, and the term hydrophilic is used herein to describe a Young's wetting angle of less than about 90 degrees. However, hydrophobic or hydrophilic functionality may extend beyond these limits in certain devices or material configurations. Super hydrophobic coatings are those exhibiting a large Young's angle for a polar liquid in a gas and are achieved by geometrically texturing a surface.

Returning again to FIGS. 1A and 1B, the display 12 includes a film 42 that includes at least a plurality of pores 72, 82. The term pore, via, or duct may be generally used herein to describe a pathway for fluid flow. The film 42 may be constructed of a polymer like polycarbonate or polyethylene-terephthalate.

The film 42 includes a third electrode 132, which may be constructed in a manner that is similar to the first and second electrodes 112, 122 described above. In some embodiments, the film 42 and the third electrode 132 may comprise, at least partially, a diffuse white reflective sheet. In other embodiments, the film 42 is optically scattering and/or the third electrode 132 has a non-planar texture. Suitable scattering materials may include polymers or fluids having particles disperse therein, wherein the particles differ in refractive index from the polymer or fluid. Scattering materials may include structured polymers or metals, microreplicated optics, holographic films, wavy or rough electrodes, or other optically scattering or diffusing features that are known by those skilled in the art of optics and displays.

The film 42 is located between, and spaced away from, the first and second substrates 22, 32. The spaces formed between the film 42 and the first substrate 22 and the second substrate 32 are referred to as a first channel 312 and a second channel 322, respectively. Each of the first and second channels 312, 322 have a respective height, $h_1$, and $h_2$, which may be set by one or more spacers 52. The spacers 52 may be made of solid materials that are similar to the solid materials used in constructing the substrates 22, 32. In some embodiments, the spacers 52 may be formed as a part of the substrate 22, 32, such spacers 52 being formed by etching, laser processing, microreplication, or other suitable technique. The spacers 52 may also be formed from optically curable epoxies or photoresists, such as MICROCHEM SU-8 photoresist (Microchem Corp. Newton, Mass.) or DUPONT Per-MX (E. I. du Pont de Nemours and Co., Wilmington, Del.). The spacers 52 do not always need to span the entire channel height 312, 322. In some cases the spacers 52 may only span a portion of the height such that fluids may occupy a space between the spacers 52 and the substrates 22, 32 for increased viewing of the fluids (i.e., increased optical performance).

The term channel or hydrophobic channel, as provided herein, may be used to describe physical confinement of a fluid that has a horizontal dimension than it is greater than a vertical dimension, and which, in some embodiments of the present disclosure, may include a manner by which to visibly display the fluid therein. The channel is generally defined or bounded by one or more walls, typically of a fabricated patterned substrate or film.

Comparatively, a reservoir may be any feature formed as part of a device, or is external to the device, including any feature that may store or hold a fluid until it is ready to be moved within, or into, a device. Reservoirs may also be simple inlet/outlet ports or vias that may or may not be connected to additional devices, chambers, or channels.

Because the spacers 52 occupy only a small visible area of the second channel 322, and if a non-polar fluid contained therein is optically clear, then the visual appearance of the second channel 322 is dominated by the film 42 or the color of the fluid residing within the second channel 322.

Referring still to FIG. 1A, a first voltage source 512 electrically couples the first and third electrodes 112, 132, and a second voltage source 522 electrically couples the second and third electrodes 122, 132. The voltage sources 512, 522 may be direct voltage sources from a power source or a locally generated voltage or current sources, such as thin film transistors. The voltage sources 512, 522 may provide control through segmented, passive matrix, and active matrix addressing schemes. The voltage sources 512, 522 may be biased by 0 V, a positive DC voltage, a negative DC voltage, AC voltage, or combinations thereof as appropriate. Numerous direct, alternating, or other types of voltage sources are known to those skilled in the art of displays or microfluidics, and are applicable.

The device 12 contains both a polar fluid 212, which may be a pigment dispersion of carbon black in propylene glycol with viscosity reducing co-solvents, and a clear non-polar fluid 222, which may be an oil, such as an alkane or a silicone. The term fluid may be used to describe any material or combination of materials, such as a liquid or a dispersion, that moves freely according to the principles of the present disclosure. The fluids may include, for example, liquids, gases, and some solid materials (such as liquid powders), and are not confined to any particular composition, viscosity, or surface tension. The fluids may also contain any weight percent of a solid material so long as that solid material is stably dispersed in the fluid, or in the case of dyes, dissolved in the fluid. The fluids may also contain mixtures of multiple fluids, dispersants, resins, biocides, and other additives used in commercial fluids with demanding optical, temperature, electrical, fouling, or other performance specifications.

Examples of the polar fluid 212 may include, but are not limited to, water, propylene glycol, formamide, ionic fluids, and possibly even liquid metals. Examples of the non-polar fluid 222 include, but are not limited to, alkanes and silicone oils, such as DOW-CORNING 0s-20 (Dow-Corning Corp., Midland, Mich.). Examples of fluid gases may include, but are not limited to, argon, carbon dioxide, and nitrogen. In some cases the nonpolar fluid 222 may be replaced by a gas.

Pigments and dyes in many cases may be solid particles that are dispersed or dissolved in the fluid to alter at least one optical or spectral property of the fluid.

In some embodiments, such as is shown in FIG. 1C, the surfaces surrounding the first and second channels 312, 322 may include a thin hydrophobic polymer coating 61 that provides a Young's angle ("$\theta_y$") ranging from about 90 degrees to about 180 degrees, and preferably 180 degrees, for the polar fluid 212 in the presence of the non-polar fluid 222. Typical hydrophobic fluoropolymer coatings may be less than approximately 100 nm thick and, when placed over the electrode 132, the hydrophobic coating 61 should be sufficiently thin and not electrically-insulating. Said another way, the thickness of the hydrophobic coating 61 does not resist electrical conduction between the polar fluid 212 and the adjacent electrode 132.

As a first approximation, a voltage applied by the voltage sources 512, 522 to a select pair of the electrodes 112, 122, 132, causes an electrowetting effect that reduces the contact angle of the polar fluid 212 to a value of $\theta V$, and may be predicted according to:

$$\cos\theta V = \frac{(\gamma_{od} - \gamma_{pd})}{\gamma_{po}} + \frac{CV^2}{2\gamma_{po}}$$

where C is capacitance per unit area of the dielectrics 102, 92; $\gamma$ is the interfacial surface tension between the polar fluid 212 ("p"), the non-polar fluid 222 ("o"), and the dielectric layer 102, 92 ("d"); and V is the applied DC voltage or AC RMS voltage applied to the selected pair of the electrodes 112, 122, 132 by the voltage sources 512, 522. The term $\gamma_{od} - \gamma_{pd}/\gamma_{po}$ is the same as the cosine of $\theta\gamma$. At the microscale, the Young's angle is unchanged during electrowetting; however, at the macro-scale, the Young's angle appears to change. For the sake of simplicity in diagramming herein, the $\theta V$ will be drawn without such consideration for the microscopic $\theta_y$. A large $\theta_y$ value causes a particular channel 312, 322 and/or the plurality of pores 72, 82 to impart a Laplace pressure on the polar fluid 212 and according to:

$$\Delta p = \gamma_{po}\left(\frac{1}{R_1} + \frac{1}{R_2}\right)$$

which includes the horizontal and vertical principle radii of curvature ($R_1$, $R_2$) for the menisci of the polar fluid 212 in contact with the particular channel 312, 322 and/or the plurality of pores 72, 82. Generally, and for the illustrative device 12, in accordance with the embodiments of the present invention, $h_1$ and $h_2$, are smaller than a horizontal width (not shown) of the respective channel 312, 322. Therefore, the change in the Laplace pressure for the polar fluid 212 meniscus is due mainly to the vertical radius of curvature, $R_2$. When $\theta_y$ is 180 degrees, $R_2$ is half the height of the particular channel 312, 322. By electrowetting the surface of the particular channel 312, 322, such that $\theta V$ is approximately 90 degrees, $R_2$ would double and the Laplace pressure $\Delta p$ is decreased by a factor of two. As applied to the present embodiment, applying a voltage to a pair of the electrodes 121, 122, 132 creates a pressure imbalance and moves the polar fluid 212 within the particular channel 312, 322. Further description of electrowetting operation is provided in S. YANG, et al., "High reflectivity electrofluidic pixels with zero-power grayscale operation," *Appl. Phys. Lett.* 97(14):143501-1 to 143501-3 (2010).

In use, and as shown in FIGS. 1A and 1B, the display 12 is shown with no voltage applied by either voltage source 512, 522. The polar fluid 212 fills the first channel 312. The Laplace pressure for the polar fluid 212 within the first channel 312 is proportional to $1_2$. The polar fluid 212 also fills the first plurality of pores 82 of the film 42, wherein each of the pores 82 has a width, w, that is significantly greater than either of $h_1$ and $h_2$. As a result, the polar fluid 212 is always in contact with the dielectric layers 102, 92 on the first and second substrates 22, 32, respectively. When each of the first plurality of pores 82 is cylindrical, up is proportional to 2. Ideally, w is greater than $2h_1$ and $2h_2$, and preferably greater than $3h_1$ and $3h_2$. Distinct from the first plurality of pores 82, the second plurality of pores 72 generally should have width (not labeled) small enough such that polar fluid 212 never wets into the second plurality of pores 72. This is achieved by having a width for the plurality of pores 72 that is ideally less than $2h_1$ and $2h_2$, and preferably less than $h_1$ and $h_2$. While the polar fluid 212 will generally move into those spaces that impart a low Laplace pressure, contact angle hysteresis may increase the pressure difference necessary to move the polar fluid 212.

It would be readily understood that the terms diameter and width should not be interpreted as limiting the geometry of the various plurality of pores 72, 82. Rather, any geometry, regular and irregular, may be used so long as the geometry satisfies the Laplace pressure conditions provided. In fact, the contact angle of the polar fluid 212 within each of first and second pluralities of pores 82, 72 could be different to achieve the same result for the Laplace pressure. For example, the first plurality of pores 82 may be shaped such that w is less than either of $2h_1$ and $2h_2$ if those pores are suitably hydrophilic.

With reference now to FIGS. 1D-1E, the display 12 has a voltage applied by voltage source 522 to the second electrode 122 and the third electrode 132. As shown, the third electrode 132 is electrically-conductive with the polar fluid 212 and the second electrode 122 is electrically-insulated from the polar fluid 212 by the dielectric 92. Therefore an electromechanical force is created that lowers the Laplace pressure within the second channel 322 between the film 42 and the second substrate 32. Reducing the Laplace pressure within the second channel 322 is observable in FIG. 1D as a larger vertical radius of curvature for the meniscus of the polar fluid 212 in the second channel 322 as compared to the smaller vertical radius of curvature for the meniscus of the polar fluid 212 in the first channel 312, where no voltage is applied to first electrode 112. This imbalance in the Laplace pressure causes the polar fluid 212 to move into the second channel 322 through the first plurality of pores 82 in the film 42, and the non-polar fluid 222 to move into the first channel 312 through the second plurality of pores 72 in the film 42. FIGS. 1D and 1E illustrate a state of the display 12 during fluid movement and are not representative of a state of equilibrium. In order for the polar fluid 212 to move from the state of FIG. 1A to the state of FIG. 1D, the first channel 312 may include splitting the polar fluid 212 at the spacers 52 positioned proximate the second plurality of pores 72 in the film 42, which is described in greater detail below.

Figure 1G:
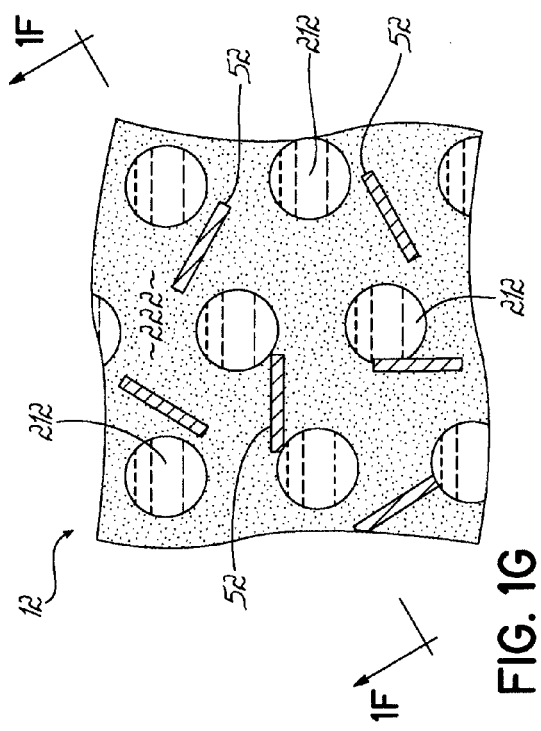

With reference now to FIGS. 1F-1G, the display 12 is shown with no voltage applied by either voltage source 512, 522. As a result, the Laplace pressure acting on the polar fluid 212 is approximately equal in both channels 312, 322 and the polar fluid 212 remains stable in an intermediate "grayscale" position partially between filling the first and second channels 312, 322. However, maintaining the intermediate position requires some amount of contact angle hysteresis or other type of wetting hysteresis, because the Laplace pressures in each channel 312, 322 will never be completely equal in practice.

Stable positioning of the polar fluid 212 in the intermediate position may alternatively be achieved if the voltage sources 512, 522 apply voltages that result in similar electromechanical pressures in the channels 312, 322.

With reference to FIGS. 1H and 1I, the display 12 is shown after a voltage is applied by the voltage source 522, for a time, to cause the polar fluid 212 to nearly or completely fill the second channel 322. The polar fluid 212 is stable in this position without continued-applied voltage.

Figure 1J:
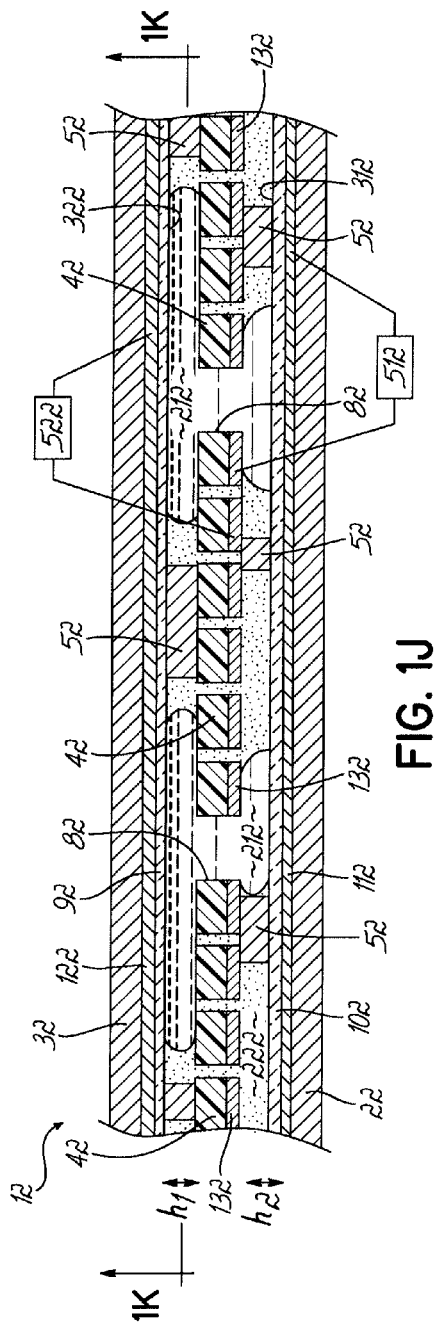
Figure 1K:
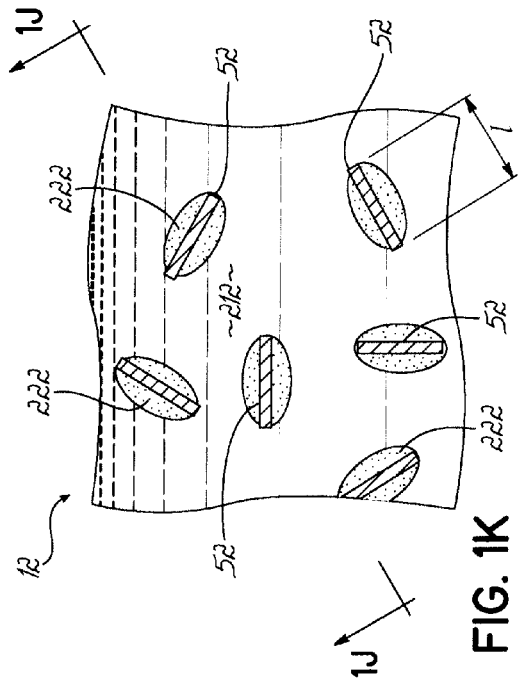

Turning now to FIGS. 1J-1K, the electrofluidic device 12 is shown with a voltage applied by the voltage source 512 to the first electrode 112 and third electrode 132. The third electrode 132 is electrically-conductive with the polar fluid 212 while the first electrode 112 is electrically-insulated from the polar fluid 212 by the dielectric layer 102. Therefore an electromechanical force is created that lowers the Laplace pressure in the first channel 312 and that causes the polar fluid 212 to move into the first channel 312.

Because the polar fluid 212 fully occupies the second channel 322 in FIG. 1H, introducing the non-polar fluid 222 into the second channel 322 to cause the polar fluid 212 to leave the second channel 322 would conventionally be difficult. However, the device 12 introduces the non-polar fluid 222 into the second channel 322 through the second plurality of pores 72 of the film 42. Thus, the non-polar fluid 222 splits the polar fluid 212 as the polar fluid 212 retracts from the second channel 322 and enters the first channel 312. In other words, the surface tension of the polar fluid 212 resists fluid splitting and the related fluid surface area increases in the second channel 322. Therefore, the non-polar fluid 222 is directed through the second plurality of pores 72 to initiate a splitting of the polar fluid 212. After an initial splitting, the polar fluid 212 may be further split, retracted from the second channel 322, and enter the first channel 312. It will be appreciated by those of ordinary skill in the art that splitting the polar fluid 212 should not create a localized increase in the Laplace pressure at the spacers 52, which would create an energetic barrier to splitting.

Returning again to the illustrated embodiment, the spacers 52 may be constructed to have at least one surface that imparts a large radius of curvature along at least one dimension of the polar fluid 212 meniscus. For example, as specifically shown in FIG. 1K, the spacer 52 may have a length, l, that is much larger than the first channel height, $h_2$. As a result, the non-polar fluid 222 is easily introduced between the spacer 52 and the polar fluid 212. While the spacer 52 does change the horizontal radius of curvature for the meniscus of the polar fluid 212, the horizontal radius of curvature is already large due to the length, l, of the splitting spacer 52. A large, horizontal radius of curvature implies a weak contribution to the Laplace pressure. Thus, for the display 12 shown in FIGS. 1A-1K, the large, horizontal radius of curvature at the spacers 52 and the contributions due to the Laplace pressure of the polar fluid 212 are weaker than the vertical radii of curvature and relative Laplace pressures of the polar fluid 212 in the first and second channels 312, 322. It would be readily appreciated that the spacers 52 are only one example of a fluid splitting structure, and that other fluid splitting structures are possible so long as the structure operate by, and satisfy, the principles of the present invention.

If the voltage continues to be applied after the polar fluid 212 is split, then the display 12 will return the state shown in FIGS. 1A and 1B, i.e., wherein the polar fluid 212 is primarily located within the first channel 312. Conversely, the spacer 52 may also be helpful in moving the polar fluid 212 from the first channel 312 to the second channel 322, which was shown in FIGS. 1D and 1E.

In this way, the spacer 52 is useful in devices in which the polar fluid 212 resides fully within one of the first and second channels 312, 322, both of which provide maximum optical performance and contrast. Yet, the spacer 52 may not be necessary in maintaining or operating in intermediate filling states of the first and second channels 312, 322 because the polar fluid 212 may already be sufficiently split when in the intermediate state.

Referring still to FIGS. 1A-1K, the spacer 52 may have any geometry that allows the polar fluid 212 to surround at least one dimension of the spacer 52 and that facilitates non-polar fluid splitting of the polar fluid 212.

In various other embodiments, the spacers 52 may also provide, additionally or alternatively, other functions. For example, if the film 42 and the third electrode 132 allow optical transmission near the spacer 52, and if the spacer 52, itself, is optically transmissive, then the device 12 may be used in both optically transmissive and reflective modes. In alternate embodiments, a first set of spacers 52 may completely surround a portion of the channels 312, 322 of the device 12 providing always separated volumes of polar fluid 212, while a second set of spacers 52 are instead surrounded by polar fluid 212 in the channels 312, 322 such that they provide splitting of polar fluid 212.

The device further includes color filters which are commonly used for creating color reflective, or transflective displays. Black matrix and color filters may be any solid or fluid material that absorbs part of or the entire spectrum of light in reflection or transmission modes.

It would be readily appreciated that the fluid splitting spacers or other fluid splitting features, as generally provided in detail herein, may be incorporated into the fluid channels of other device structures. For example, conventional electrofluidic displays, such as those described in J. HEIKENFELD, et al., "Electrofluidic displays using Young-Laplace transposition of brilliant pigment dispersions," *Nature Photonics*. 3:292-296 (2009), may incorporate one or more spacers and polar fluid splitting techniques as described herein. Specifically, the electrofluidic displays of the reference include a channel into which a polar fluid is pulled (by an applied voltage) and a reservoir that receives the polar fluid when no voltage is applied. By incorporating the one or more fluid splitting spacers in accordance with an embodiment of the present invention, there is no need to precisely define the borders of adjacent pixels of the device, which otherwise would result in the polar fluid of adjacent pixels merging. Therefore, the spacers may be located within the channel to promote splitting of the polar fluid in that channel. It would be understood that a fluid splitting structure in accordance with an embodiment of the present invention may be used in alternative, or in addition, to the spacers. In an alternate embodiment, the reservoirs would be fluidically connected such that any imbalance in volumes of split polar fluid would be redistributed in the reservoirs.

Regarding fabrication of the film, devices in accordance with one or more embodiments of the present invention may be constructed in a variety of ways. In one such embodiment of the present invention, fabrication of the film included in the device may include techniques that are known and include, for example, microelectronics, microreplication, light management films, membrane filtration films, or other thin porous or structured films. The films may be fabricated with spacers, the spacers fabricated by microreplication; depositing a photo-definable polymer and using photolithography to develop the spacer; laser etching; screen printing; or other suitable approaches. In those embodiments in which the film includes one or more pores, the pores may be formed by microreplication; wet or plasma etching; laser ablation; photolithography; or other suitable approaches. In those embodiments in which the film is very thin, the film may be fabricated on a carrier to facilitate ease of handling and/or lamination of the thin film. More specifically, in one embodiment of the present invention, a film may be fabricated from a carrier substrate having one or more trenches, which are the inverse geometry of the spacers. The carrier substrate is coated with a negative-acting UV-curable epoxy like solvent-free SU-8 melted at greater than 55° C. or Norland epoxies used in microreplication. The pluralities of pores, small diameter, large diameter, or both, may be fabricated using photolithography of the epoxy. The porous film is then coated with a reflector if the film is not already reflective itself. In other embodiments, the pores in the films may be fabricated into a film of polycarbonate or polyethylene-terephthalate by ion-track etching (commonly used to create membrane filters). Alternately, UV exposure of polyethylene-terephthalate in a raised pressure and temperature formamide bath may allow photo-defined etching of pores. For some devices, it may be desirable to fabricate the films with monolithic integration onto a lower substrate, such as by layer-by-layer build-up.

Regarding bonding, when fabrication of a film is complete, the film with the carrier may then be bonded onto a lower substrate containing previously manufactured drive circuitry, spacers, and/or other features. The carrier may then be released from the film. An upper (i.e., the viewing) substrate may then be laminated onto the film and the lower substrate.

Regarding reflection, reflection may be achieved with metal films (for example, Al or Ag), but enhanced reflection may be achieved using one or more of several methods, such as, layers with different refractive indices, such as multilayer dielectrics; particle-filled polymers or fluids where the particles differ in refractive index from the polymer or fluid; one- or multi-dimensional photonic crystals; paper; porous materials; retroreflectors; or other known materials that may improve visible reflectance. In those embodiments in which the reflector is constructed from an electrically-conductive material, the reflector may also serve as an electrically-conductive electrode. In other embodiments of the present invention, a high precision metal or Si mold may be micromachined with a light scattering surface texture. Next, the film is microreplicated with the mold, and then the film may be coated with a reflector. The texture of the film creates a diffuse, semi-diffuse, directional, or optical gain-reflector.

Regarding fluid dosing and sealing, the fluids may be dosed into the device using one of several methods. For example, the polar fluid may be emulsed with the non-polar fluid and then physically, chemically, electrically, thermally, or optically separated after the device is completed. The polar fluid may be dosed into the device, the non-polar fluid added, and the device sealed. The non-polar fluid may be dosed into the device, the polar fluid added, and the device sealed. The polar fluid may be electrowetted into an area by application of a voltage between the polar fluid and an electrode. The polar fluid may be dosed and pressed between two plates as done for liquid crystal displays in "droplet dosing." Numerous alternatives and combinations of dosing combinations are included within the spirit of the present invention.

The above description provides examples of materials and components for embodiments of the invention; however, the description of any particular one embodiment is intended to cover all alternative materials, components, and arrangements known by those skilled in the arts of optics, displays, microfluidics, filtration and separations membranes, electrowetting, electrofluidics, microfabrication, electronics, and related disciplines.

The display performance with respect to the various embodiments of the present invention may be calculated for pixel densities ranging from about 1 pixel-per-inch ("PPI") to about 1000 PPI. A review of performance requirements for devices is provided in J. HEIKENFELD, et al., "A critical review of the present and future prospects for electronic paper," *J. Soc. Inform. Display.* 19(2):129-156 (2011). Table 1 includes calculations made using proven models for electrofluidic transport, including light outcoupling losses, and are benchmarked off actual data measured for 25 PPI pixels (see Example 3). It is clear that various devices in accordance with one or more embodiments of the present invention may satisfy bill-board application pixel resolutions (1 PPI) and speeds (<1 s). It is clear that the present invention can satisfy tablet, phone, and e-reader applications (>300 PPI) where video rate (<20 ms) speed is required.

In terms of optical performance, several comparisons may be made. Firstly, the present invention, in combination with a diffuse reflector surface, more than five times as reflective E INK (E Ink Co., Cambridge, Mass.) electrophoretic displays (~250% vs. ~40%) over a useful viewing cone. In color mode, using a RGBW color filter approach, the E INK provides about 16% reflection by calculation, whereas the present invention could provide greater than 60% reflection. The present invention may also utilize color filters with fluorescent (photoluminescent) enhancement.

Figure 2:
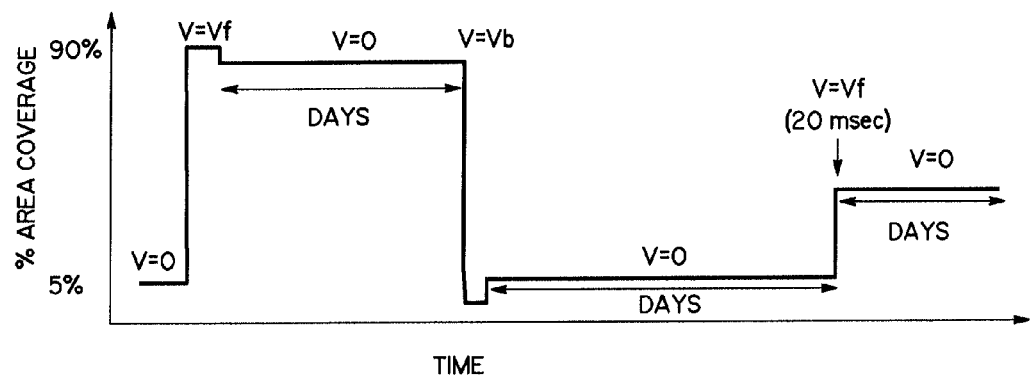
FIG. 2. is a bistability diagram.

Referring to the exemplary data in FIG. 2, the percent area coverage of the polar fluid on the electrodes in the viewer-side channel changes from approximately 5% to approximately 90% with the application of voltage to the frontside electrode (V=Vf) in the viewer-side channel. The change in area coverage takes less than 100 milliseconds, and typically less than 30 milliseconds. In FIG. 2, the voltage is left on for a period of time, and then turned off and is not to scale in the graph. Typically this time would be less than 1 second. FIG. 2 illustrates a small decrease in area coverage with removal of voltage, which is generally less than a change of 10% of the area coverage. Likewise, application of voltage to the backside electrode (V=Vb) causes a change in area coverage from approximately 90% to approximately 5%. The area coverage percentage both before the applied voltage (5%) and after the applied voltage (90%) is stable in the absence of applied voltage (V=0). The area coverage is stable in the absence of applied voltage to within 10% are coverage for more than one hour, and generally more than 24 hours, and typically more than 200 hours (not shown). In addition to the full area switch in example, application of lower voltage to the electrode, or the same voltage for less time (i.e. V=Vf for 20 milliseconds) results in a smaller change in area coverage, and each area coverage percentage is stable to within 10% over at least 1 hour. The produces intermediate of 'grayscale' states, often defined in bits, wherein the area coverage percentage changes by a factor of two between bits.

Figure 3:
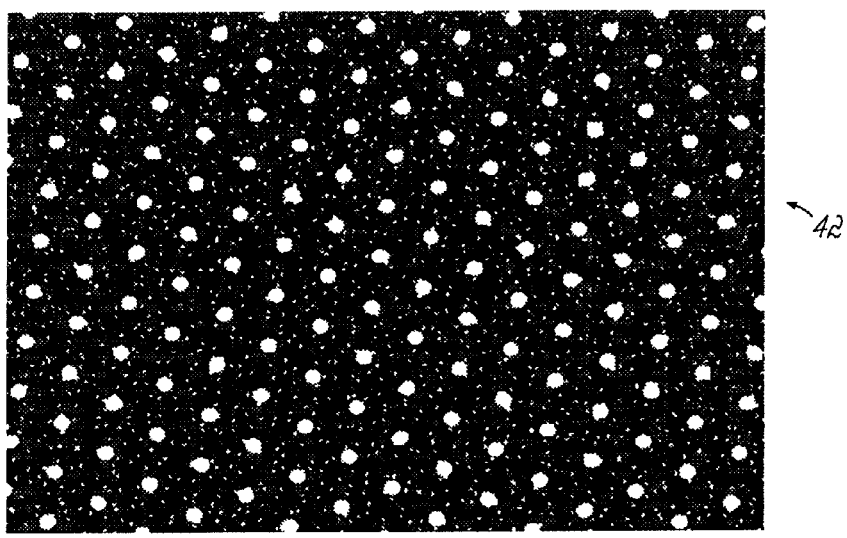
FIG. 3 is an exemplary imaging film with through holes therein.

Referring to FIG. 3, a microscope image of the film component (42) of the display device, which has multiple design and manufacturing requirements. The film material must be mechanically robust enough for handling and tensioning at a thickness of 10 micrometers while hosting a population of holes ranging from approximately 40 micrometers to 4 micrometers. Each film design has holes having two distinct defined sizes. An exemplary 92 dpi film component (42) has through holes of diameters 32 micrometers and 7 micrometers with an areal hole density of 5% and 60,000 large holes per $cm^2$. The film component (42) must withstand processing that includes deposition of a conductive film such as Al via evaporation or sputtering, and deposition of a fluoropolymer. Preferably, the metal area is deposited in a specific pattern which includes the device active area and at least one bus line for electrical connection. This reduces the occurrence of electrical shorts by limiting the conductor near I/O/lines. The fluoropolymer may be deposited from solution and thermally annealed between 100° C. and 180° C. in temperature. Suitable fluoropolymers include Fluoropel (Cytonix), Cytop (Asahi), or Teflon AF (Dupont). The fluoropolymer may also be deposited with a vapor deposition method with exemplary materials including parylene F and CF4 polymers, with materials and deposition systems provided by SCS coatings (Indianapolis, In) and GVD (Cambridge, Mass.). Consequently, the film component must withstand these processing conditions, and clearly have a flow point above these temperatures. It should be noted that the hydrophobicity of the film in the area of the module seal must be eliminated in order to provide good sealing adhesion. More preferably, the fluoropolymer is eliminated in both the seal areas and over the I/O lines. This can be accomplished by methods including selective spatial deposition of the fluoropolymer by flexo-gravure printing, slot-die coating, spray-coating, masking of the deposition, or chemical modification after deposition.

For the display application, the film must also have an optical surface with a defined non-specular profile. Example profiles and optical properties of a film surface for the display application are described in US2013/0335805, "Controlled Diffuse Scattering for Displays". The optical performance of these surfaces is controlled by the texture (microscopic topography) imparted to the surface.

The film component (42) must also be robust to the ink and oil materials sealed into the display module and bond to adhesives used to seal the display. It must be stable in contact with these materials from −30° C. to 85° C. Non-limiting example chemicals found in various inks, oils, and sealants include dodecane, cyclopentane, cyclohexane, heptyl-cyclohexane, Exxon isopar M, Exxon isopar V, Dupont OS20, Dupont OS30, water, ethylene glycol, propylene glycol, gamma butyrolactone, alcohols, urethanes, epoxies, and acrylates. This chemical robustness is critical; various polyamide and acrylate formulations are not robust enough. Polyethylene Teraphthalate (PET), Heat-stabilized Polyethylene Teraphthalate Polyethylene napthalate (PEN), polyimide, and urethanes and urethane acrylates are non-limiting examples of materials that are robust to these chemicals.

The film component (42) must also be manufacturable with a cost-effective, high volume technique, preferably a roll-to roll technique. A key challenge is making a film with large population of though-holes with diameters less than 40 micrometers. Roll-to roll techniques for making through holes include laser-drilling, hot embossing, track-etching, and UV film casting. Laser drilling of single holes (for example in PET and PEN) is not cost-effective and can produce volcano-like structures around the holes that interfere with fluid flow.

An exemplary method of making a film with a tailored optical surface, containing populations of pores with two defined sizes, using a batch process, is as follows. First, a carrier template is created from a substrate transparent to certain wavelengths of light, such a glass. An epoxy photoresist such as SU8 is coated onto the substrate. A negative stamp of the diffuser pattern is placed onto the SU8 and run through a laminator to transfer the pattern into the SU8. The SU8 is then cured and the stamp is removed. The stamp itself can be prepared from a master of laser-written photoresist, producing a controlled 3-D pattern. This pattern is then coated with a seed metal layer and then an electroplated layer is formed. The photoresist is then removed, leaving a metal negative of the pattern. The final stamp is made by casting PDMS over the metal pattern to form a PDMS stamp. The next step in creating the carrier template is creating an opaque mask for the holes. Thin opaque metal is coated on the template via evaporation or sputtering. Photoresist is coated on the template and patterned to produce a mask of with the hole pattern on the template. In one embodiment, the photoresist over the metal film is a robust epoxy that is set to the height of the film to be cast, and remains on the template during the casting process to help define the through holes. In another embodiment, the photoresist over the metal film is removed and the metal film defines the through holes.

In another example, a highly-robust template may be created by laser-writing onto photoresist the diffuse surface and post array. An electroformed daughter is created from this pattern, now having a diffuse surface and an array of posts. This metal daughter is then used to stamp a hot sheet of glass to create a template. A thin layer of black metal oxide pigment is then deposited onto the glass posts, preferably by preferentially coating the high features.

To make the film, a UV curable resin, preferably a low cost urethane or urethane-acrylate polymer blend with a photo-initiator and release chemical mixed in, is cast onto the template by extrusion-coating, spin-coating, spray-coating, or other methods suitable for producing a uniform, nominally 10 micrometer thick film. Examples of suitable components for the resin include acrylates and urethanes (example materials are sold by Sartomer and Norland), BASF Irgacure 4265 and internal mold release materials). The UV resin is then exposed and cross-linked through the back-side of the template, so that the opaque features block exposure of the UV resin. The uncured resin is then rinsed away with a suitable solvent such as PGMEA. Next, the film is peeled off from the template. The template is suitable for hundreds of film castings. The photo-initiator can be chosen to react in the UVA, UVB, or visible wavelengths. In one example, a suitable photo-initiator, BASF Irgacure 4265 has been used that responds quickly to 380 nm to 405 nm light, thereby enabling the use of LED exposure systems.

To complete the film for the display device, the film is coated with an optical reflector metal (such as Al or Ag) and the fluoropolymer, by the selective area deposition. An example of a suitable method for selectively depositing the said metal is to position the film relative to a shadowmask during sputtering or evaporation of the film. This shadow-masking process can be accomplished in a batch process, or in a roll-to roll process where the roll feed is stepped, stopped, the deposition is made, and the cycle is repeated. The fluoropolymer is selectively deposited by methods listed above.

Figure 4:
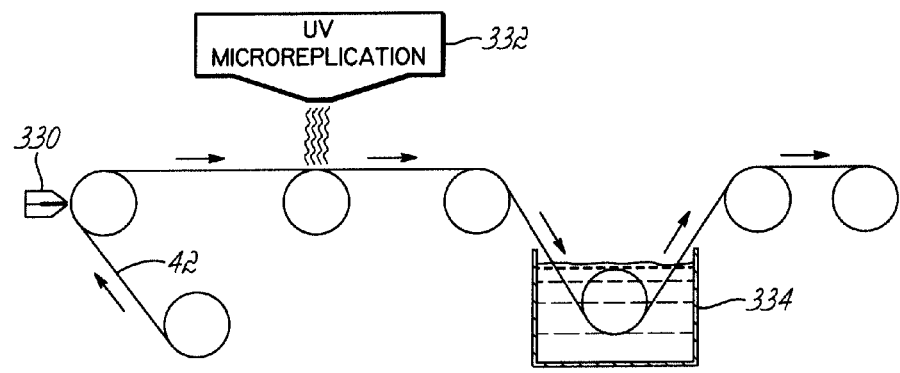
FIG. 4. is an exemplary diagram depicting a method for manufacturing the imaging film.

Referring now to FIG. 4, the film 42 can also be made in a continuous process using roll-to-roll processing, which generally has the advantage of lower manufacturing costs. In a preferred embodiment, the roller is transparent to UVA and blue light and fabricated with an internal UVA or blue light curing source. Such rollers are manufactured by Suss Microtech. An exemplary method for creating the stamp on the roller is first to create the diffuse surface on the roller by coating the roller with a durable metal, and then with photoresist. Using a drum laser-writer, the resist is exposed to leave a pattern of dots corresponding to pores. After resist develop, the exposed metal is etched and the metal dots that are opaque to UV or blue light remain as the roller mask. The robustness of the mask can be improved with a transparent hardcoat. The robustness can also be improved by coating the roller with a fluoropolymer to prevent resin adhesion to the roller. In an exemplary embodiment of a continuous roll-to-roll process, a carrier film such as PET is micro-replicated with optical surface pattern, using a roller that has surface texture formed from a 3-D laser-writing pattern, and electroforming processes to form a composite carrier film. The carrier film then provides the texturing to create the optical surface in the cast film. This composite carrier film is slot die coated 330 with a UV curable resin to a thickness of nominally 10 micrometers. The film continues to a roller UV curing step 332, and the rollers then direct the film into a bath 334 of developer (such as PGMEA). The roll continues out of the bath 334 to a rinse and dry step, and the film and carrier are rolled up. The roll is then taken to the delamination station of rollers where adhesive is applied to the cast film to initiate separation, and then wound onto a separate roll from the carrier. The film is then run through metallization and fluorpolymer coating steps, as described above.

There are many additional embodiments of this process. For example, the optical textured surface can be imprinted into the transparent roller instead of the carrier film. In another embodiment the carrier can be replaced with a thin foil (nominally thinner than 10 micrometers), embossed with the optical surface pattern. A thin UV resin between 0.5 and 10 micrometers is coated onto the foil, photopatterned and developed. The Al is etched in a suitable wet or dry etching process to form through holes. The composite aluminum-polymer film is the film and the 'removal from the carrier' step is eliminated.

Another method for forming the porous film uses a two-stage track etching process to form two hole sizes. Track etching uses high energy particles (ions, neutrons, etc.) to create damage tracks in thin films such as PET, polycarbonate and PEN with a starting thickness of nominally 25 micrometers. The film is then etched in a caustic solution, reducing the overall film thickness and preferentially etching to damage tracks to open pores. In this method the hole size and the film thickness are related; bigger holes are achieved with a thinner film. The density of holes is controlled by the dose of high-energy particles. High temperature PET and PEN are suitable materials for the display film. Such a film with two distributions of hole sizes and densities can be made by first exposing the film to a first dose of high energy particles with a first density, etching those holes partially (thereby reducing the film thickness), and the exposing the same film again to a second dose of high energy particles with a second density, and completing the etching. Hot embossing from a textured roller is then used to transfer the optical surface pattern into the film.

In another example, a suitably robust film with two defined sizes of holes is manufactured on a roll to roll embossing line. A roller or set of rollers is produced through the drum laser-writer process, having features to emboss the pattern of holes. A suitable high temperature film material such as high temperature PET, PEN, or a blend of suitable polymers is selected. The rollers emboss the film and substantially thin the film material in the locations of the holes. The holes are completely opened by running the film through an etching step. Examples of etching steps include a caustic solution or a gas plasma.

It should be noted that a thin film with carefully controlled sizes of through holes is also highly useful in other fields, including filtration and biological separation. In short, this film would be suitable in any application currently served by track etch membranes, especially those that benefit from tighter control of pore size, distribution, areal density, or any combination of these traits, or lower cost. The methods for making a chemically-robust thin films with through holes described in the various embodiments above enable a variety of additional applications in filtration and bioscience.

Figure 5:
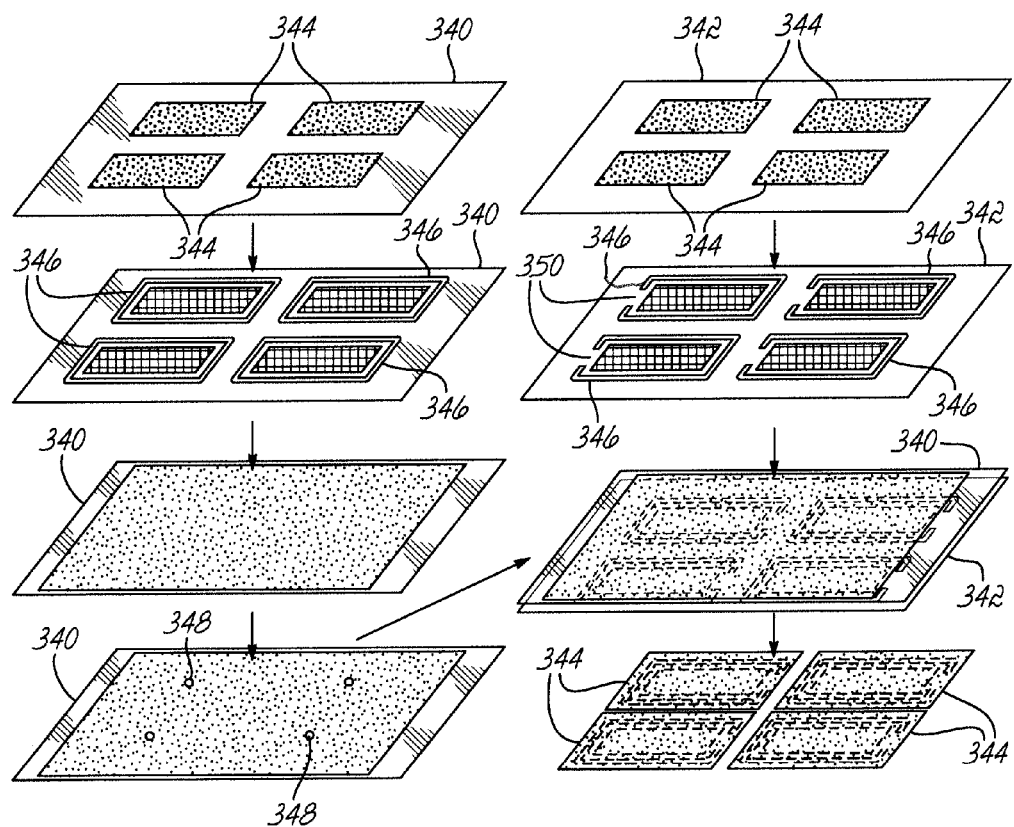
FIG. 5 is an assembly process incorporating multiple modules per panel.

With regard to creating a sealed device or display module, the film must be sealed into the module along with two different fluids while eliminating air bubbles and providing uniform distribution of the fluids. In an exemplary embodiment, as shown in FIG. 5, the sealing process begins with two large glass sheets, one being the top plate 340, and one being the bottom plate 342. The top plate 340 is distinguished as the transparent plate that the viewer looks into. On these sheets, structures for multiple devices have been patterned in generally a geometric array. For example, 60 structures of 4" diagonal displays are fabricated on a Gen3.5 sized (600 mm×700 mm) sheet of glass. Only four displays 344 are shown for clarity. In the case of passive matrix displays, these structures on the glass contain patterned conductor lines, dielectrics, spacers and fluoropolymers on both top and bottom plates. In the case of active matrix displays, one plate also contains a thin film transistor backplane. Adhesive 346 is applied to the seal array of each display module 344. Example techniques include screen-printing, flexo-gravure printing, and syringe-type dispensing. Example seal materials are UV-curable or thermally curable epoxies with viscosities between 10 cp and 100,000 cp. These materials may include spacers balls 348 to help set the channel height. The sealants 346 must be impervious to and non-reactive with the fluids that will be filled into the device. Many suitable formulations are used in the liquid crystal display industry, both with and without spacer balls 348. The sealants 346 adhere to both the polymeric film and the coated glass-based plates 340, 342. In order to provide the thinnest seal possible, it is most preferable if the sealant is deposited on one plate up to 50% thicker than the spacers, and in near the final seal width. It is also desirable for the seal adhesive 346 to overlap the fluoropolymer-coated region of the structure to prevent colored polar fluid from collected at the exterior. It is additionally desirable for the surface character of the adhesive 346 that is exposed in the interior of the module to have a hydrophobic character, to prevent the colored polar fluid from collecting at the exterior. After the adhesive 346 is applied to one plate, the film, preferably stretched taut on a frame or roller, is laminated to the structure, in contact with the adhesive 346. The adhesive is then cured. Clearly, UV curing is most expedient, but thermal curing is also possible. In an additional embodiment, conductive spacer balls may be used in the adhesive to make electrical connection between the film electrode and the top or bottom plate, or between the electrodes on the top plate, and electrodes on the bottom plate, primarily for routing all the I/O lines on a single plate.

Next, the first fluid is dispensed into each display module 344. In one embodiment, the first fluid is the non-polar fluid. A droplet of non-polar fluid placed onto the film wicks through the porous film readily and fills the bottom channel. Next, adhesive 346 is applied to the second plate 342 in the appropriate region of each device structure. This adhesive 346 is preferentially a UV-curable adhesive. Adhesive 346 is left open on one end, leaving a fill port 350 location, preferably on a side that is free from electrical interconnects. The second plate 342 is aligned and brought into contact with the first plate 340. The adhesive 346 is cured. A laser (not shown) is then used to cut the film at each die. The laser is selected for wavelength, focal distance, and location so that it cuts the film without cutting the conductive electrical interconnect lines. Next, each module is scribed out of the back sheet, with the top plate and bottom plate typically having different scribe patterns. In one embodiment, a razor is used to further cut regions of the film back to the seal area.

To fill the second fluid, in a manner similar to the filling of liquid crystal displays, the modules are stacked together in a vacuum chamber over a trough of the second fluid. The air is pumped out of the system and the modules, and the modules are dipped into the trough of fluid. Next, the pressure in the chamber is increased, driving the second fluid into the chamber. The stack is removed from the vacuum chamber, squeezed to set the proper cell height, while pushing some fluid out of the fill port. The fill port is cleaned, and a second, UV-curable adhesive is applied and cured, making the final seal.

In some cases during the polar fluid fill, the second polar fluid may push the non-polar fluid out of the lower channel, resulting in a single fluid phase in the top and bottom channels. A burn-in phase of applied electrofluidic potential to one plate can be used to pull the polar fluid into the top channel. An additional embodiment to minimize this problem is, prior to the second plate seal, to dispense a distributed array of droplets of polar fluid onto the film in each device area, similar to an LCD 1 drop fill approach. This spatially-distributes most of the ink in the channel prior to the vacuum fill step, and keeps the polar fluid off the adhesive during curing. In another embodiment, before the second plate seal, at least one drop and preferentially multiple droplets of polar fluid is dispensed onto the porous film of each device. This fluid may be rolled into the bottom channel of each module with a low surface energy roller. Next, the second plate is bonded to the first plate. Once the modules are singulated, they are stacked together and placed into a vacuum chamber. While the air is pumped out, the stack is cooled to nominally −60° C., wherein the polar fluid becomes extremely viscous. The module fill ports are dipped into the non-polar fluid, and the lower viscosity non-polar fluid fills the channel without disrupting the polar fluid. The modules are removed from vacuum and the final seal is completed. In still another embodiment, the film and plates are sealed together is a single step. An emulsion of the polar and non-polar fluids is created. The module is vacuum-filled with the emulsion and sealed. The emulsion then separates into polar and non-polar phases over time, or with external stimulus including electrical, photo, or thermal.

With regard to achieving a low enough operating voltage to utilize less expensive display drivers, the dielectric stack design and the method of operation are important. For high reliability, it is desirable to use a thick, highly-conformal inorganic high K dielectric layer. However, it is advantageous to create a stack containing an organic dielectric as well. Each material tends to be resistant to electrical breakdown in one polarity of drive signal. The stack is effective at increasing dielectric reliability for bi-polar signals. However, because the stack is a capacitor, most voltage falls across the organic dielectric, which traditionally has a low K property. Moreover the electrowetting surface has a coating of fluoropolymer, which typically has a dielectric constant of 2.2 and thereby sees a significant amount of voltage drop as well. Drive voltage below 20 V, and more preferably below 15 V (the level of current Si designs for ePaper), and more preferably, below 10 V (the level of current Si designs for bistable LCDs) are desired. In one example, a stack of 100 nm of alumina deposited by atomic layer vapor deposition (dielectric constant 8), combined with 100 nm of Parylene-HT (dielectric constant 2.4), combined with 50 nm of fluoropolymer provides an operating voltage below 20 V. Other exemplary materials for the inorganic layer are vapor deposited SiN ($K\sim$ 6), liquid-deposited SiTi (Nissan Chemical, $K\sim$ 14), and Titanium sol gel. Alumina, SiN, SiTi, and $TiO_2$ all require temperatures of 180° C. or higher for dielectric quality. Suitable inorganic materials include parylene C, polyimide, benzocyclobutene, hydrogen silsesquioxane.

Figure 6A:
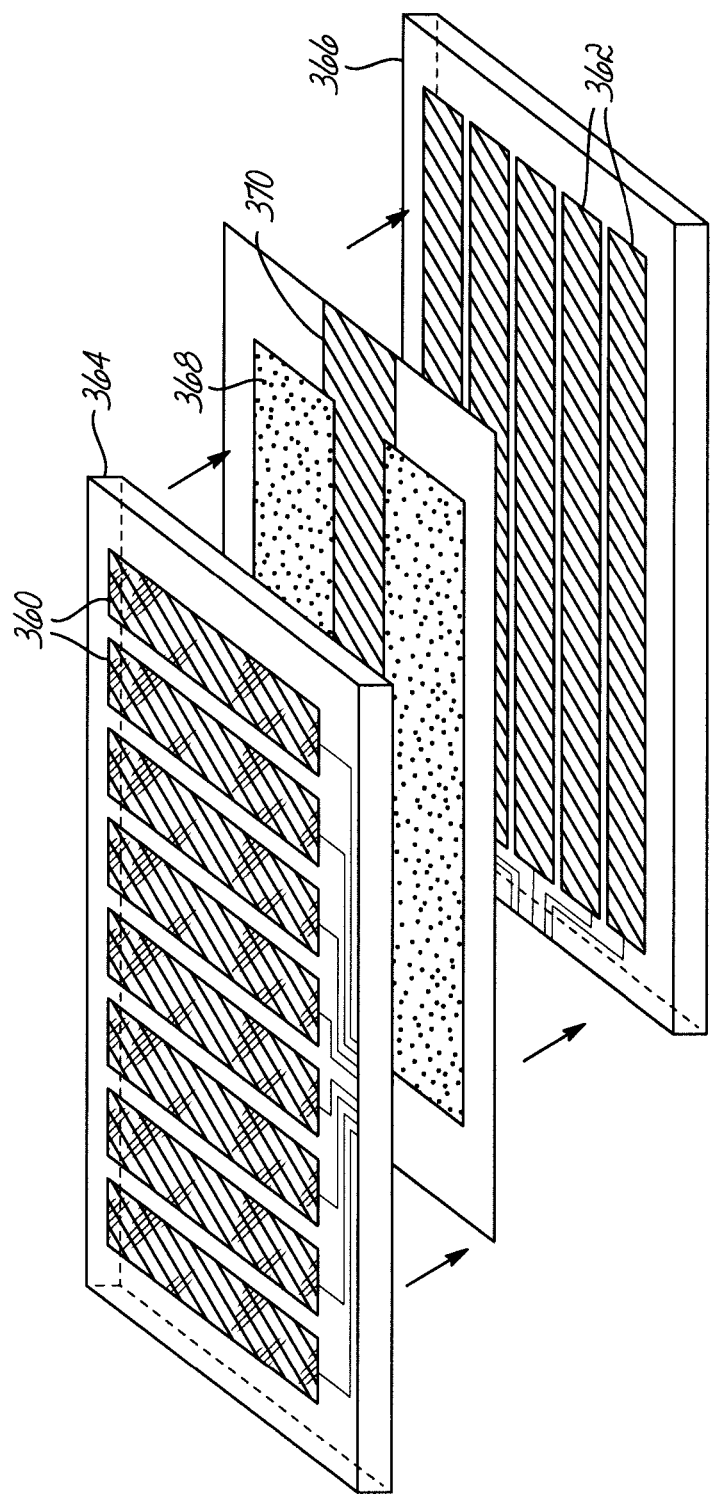
FIGS. 6a,b are a passive matrix electrode arrangement and a timing diagram for passive matrix driving FIGS. 7a,b are active matrix timing diagrams.
Figure 6B:
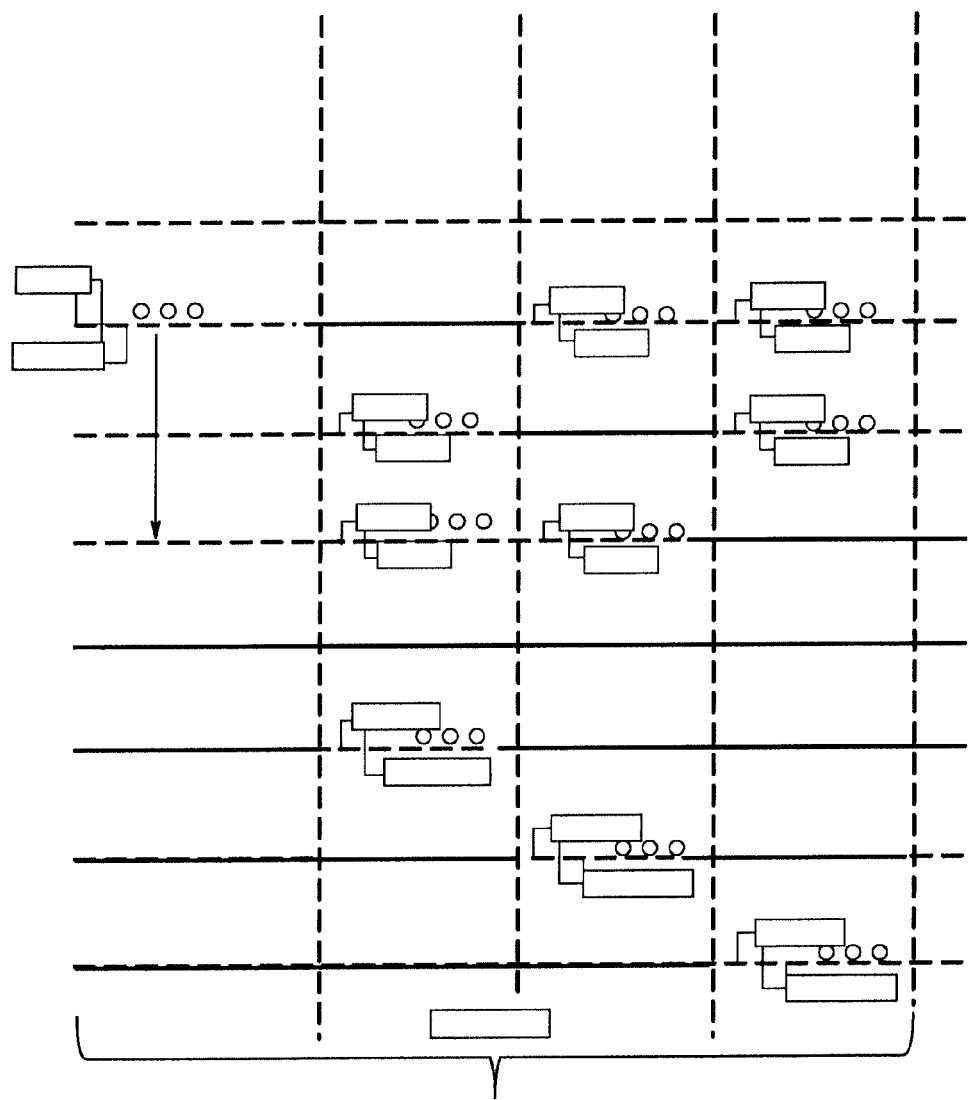
Figure 7A:
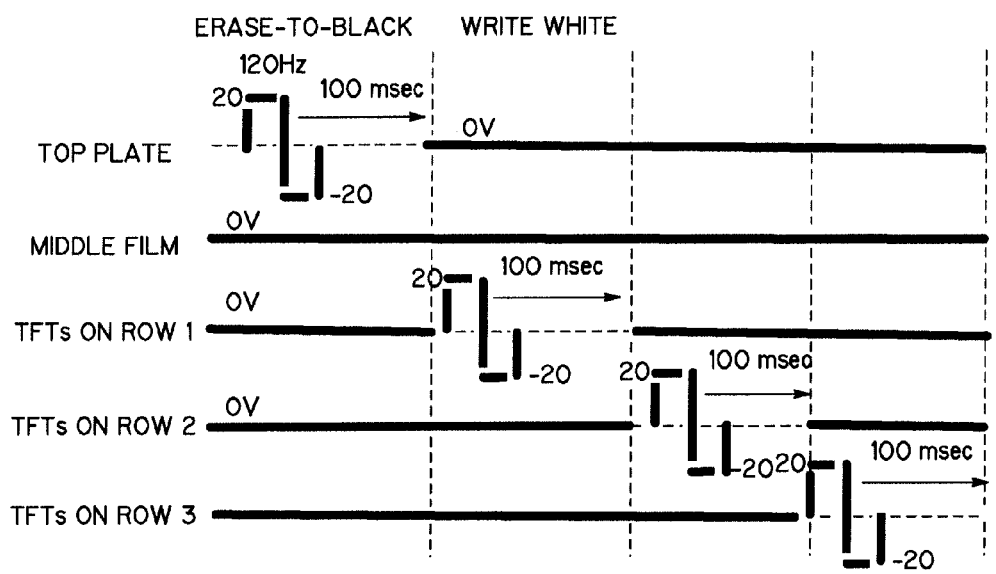
Figure 7B:
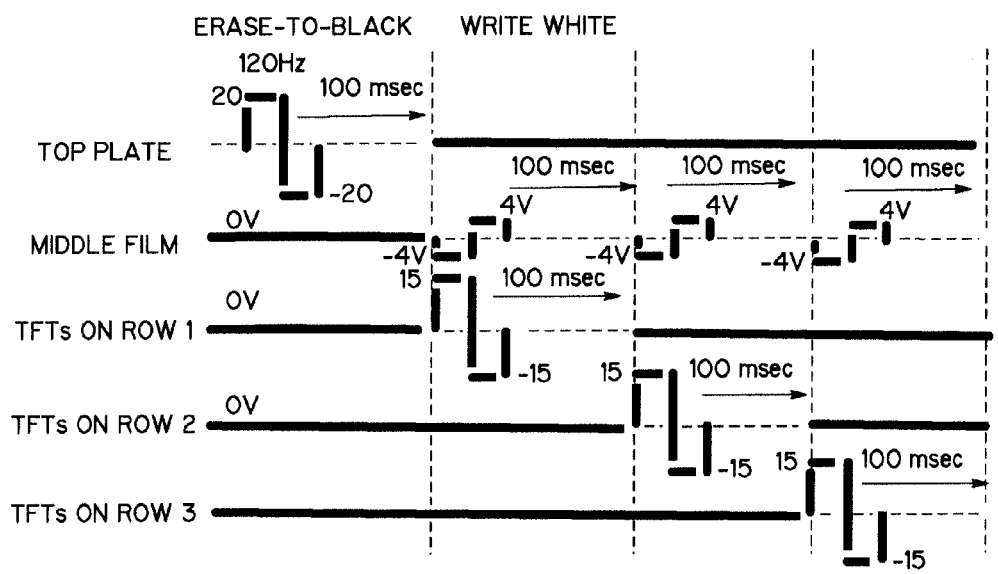

With regard to driving electrical signals to form information content on a display module formed from the device and materials described above, segmented, passive matrix, and active matrix architectures may be used. Referring now to FIG. 6a, an exploded view of a passive matrix display module shows electrodes on top and bottom plates, with the porous film in the middle. An important characteristic of Laplace pressure-stabilized channels is that there is a threshold voltage, below which the fluids do not move. That voltage is typically ⅓ to ½ the voltage required for full contact angle change on the electrowetting dielectric stack, also the voltage of maximum switching speed. Unlike electrophoretic-type displays, this threshold can be used to support passive matrix. An example passive matrix timing diagram is shown in FIG. 6b with exemplary voltages, wherein rows are on the top plate and columns are on the bottom plate. In an additional embodiment, the middle film layer can be biased by a few volts to reduce the overall voltage necessary for driving the display. For example, during the erase frame in FIG. 6b, instead of applying +/−21 V, it is advantageous to use +/−15 V, which is compatible with existing driver integrated circuits. This can be accomplished by applying +/−15 V to the rows, while applying −/+6V to the middle electrode and columns. For active matrix, two timing diagrams are shown in FIGS. 7a, 7b. FIG. 7a illustrates a higher voltage drive scheme, while FIG. 7b illustrates a lower voltage drive scheme achieved by bias the film electrode from a grounded potential to one that has an opposite polarity potential of a few volts (−/+4V) volts relative to the electrowetting plate that is being addressed.

With regard to reliable operation of the device, the coatings and materials in the module must be robust to the fluids, particularly the polar fluid. Propylene glycol is an example of a fluid that provides reliable behavior for the film and for the fluoropolymer layers. It is desirable to add ethylene glycol to the polar fluid to decrease viscosity and increase switching speed. However, ethylene glycol requires additional stability from the porous film and the fluoropolymer layer. In one embodiment of high reliability, the polar fluid is clear, while the oil is dyed. In this embodiment, the textured surface of the film should be opposite the view side, and the film must be transparent. This configuration hides any residual oil trapped in the texture of the diffuser since the textured surface is behind the reflective metal on the porous film relative to the viewer.

In another embodiment of the invention, electrowetting surfaces can be used as a total internal reflection (TIR) frustration device. Such a total internal reflection frustration device is described in U.S. Pat. No. 6,865,011 with an electrophoretically driven fluid system contacting the back side of a structured surface. The configuration is limited by the electrophoretic colorant materials and their optical densities, and the drag associated with moving the electrophoretic particles through the fluid media. Speed of switching is important for both video and 3D image applications. An improved approach is to create a textured surface within a top surface, the said surface having a viewer side with a higher refractive index than the second side. This configuration sets up total internal reflection from the surface as long as the second surface does not have a higher index of refraction material adjacent to it and opposite the viewer side surface. When a higher index of refraction material comes within a few wavelengths of the second surface, it interacts with the evanescent wave, frustrating the internal reflection. An electrowetting surface is a hydrophobic surface, meaning that the surface is covered with hydrophobic material. Moreover, the index of refraction of suitable hydrophobic materials (Ex: Fluoropel, Cytop, Teflon AF) typically lie in the range of 2.0 to 2.4, making them ideal low refractive index materials for setting up total internal reflection. Other surfaces also provide an electrowetting effect including Parylene HT and Parylene C, with higher indices of refraction. In electrowetting and electrofluidic devices, a non-polar fluid preferentially positions itself on such a hydrophobic surface in the absence of applied voltage.

In one embodiment, a suitable low index of refraction non-polar fluid (generally an oil), is in contact with the hydrophobic surface to a thickness of 3 micrometers, and preferentially 10 um, so that total internal reflection is preserved, created a white state. With the addition of applied voltage, a second polar fluid can be attracted to the hydrophobic surface to frustrate the total internal reflection. Such a fluid would have a higher index of refraction than the second surface, and preferably, optically attenuating characteristics over the spectrum of interest, such as would be obtained with pigments or dyes. Non-limiting examples of low index non-polar fluids include fluorinated alkanes and cyclic alkanes such as perfluorooctane (1.255), Fluorinert (1.29), perfluoro 1-,3 dimethylcyclohexane (1.3) or specialty fluids that can be obtained from Cargille. Some fluorosolvents can dissolve fluoropolymer films, so alkanes with low index may also be used to prevent material incompatibility. Non-limiting examples of high index polar fluids that frustrate total internal reflection include propylene glycol (1.43) and glycerol (1.47).

In an alternative embodiment for improved material compatibility, a high index of refraction non-polar fluid, incorporating pigments or dyes, frustrates the total internal reflection in the non-powered state (no voltage applied). Non-limiting examples of non-polar fluid with a high index of refraction for capturing the evanescent wave include silicon oil (1.52), and commercially available immersion oils from Cargille (1.5<n<1.6). A second polar fluid is present in the vicinity of the hydrophobic surface, and upon application of voltage, the polar fluid contacts the hydrophobic surface, thereby restoring total internal reflection. The optically non-attenuating polar fluid has a low refractive index. Non-limiting examples include water (n=1.33), ethylene glycol (n=1.43), methanol (n=1.33), propanol (n=1.38), and mixtures thereof.

In an alternative embodiment, the TIR surface can be covered with a material with a neutral surface energy, which is not strongly hydrophobic or hydrophilic. In the state with no applied voltage, a suitable polar solvent, such as water (n~1.33) is in contact with the second surface, allowing internal reflection. An electrowetting electrode is located elsewhere in the system (for example an additional plate separated from surface 2 by a fluid). The hydrophobic surface is then in contact with a non-polar fluid having a high refractive index, such as silicon oil (1.52), and commercially available immersion oils from Cargille (1.5<n<1.6). With the application of voltage, the polar fluid is attracted to the electrowetting electrode, thereby moving it from the TIR surface 2, and replacing it with the high index of refraction material. The result is TIR frustration.

This has been a description the present invention, along with the preferred method of practing the present invention, however, the invention itself should only be defined by the appended claims, wherein we claim:

1. A method for fabricating a sealed module, said module containing a polar and non-polar fluid, comprising the steps of:
    providing a bottom plate with a population of patterned devices including spacer features,
    applying adhesive to the exterior of each device area on the bottom plate,
    laminating a freestanding porous film to the bottom plate and bonding it with the adhesive,
    dispensing a first fluid into each device area,
    providing a top plate with a population of patterned devices including spacer features,
    applying adhesive to the top plate,
    bonding the top plate to the film and bottom plate, the populations of patterned devices on the bottom plate and on the top plate being aligned to form a population of modules,
    scribing the plates and singulating the modules,
    cutting the porous film,
    vacuum filling a second fluid into the modules, and
    end-sealing the modules.

2. The method for fabricating a sealed module as claimed in claim 1 whereas the non-polar fluid is filled into the top-facing channel of the modules.

* * * * *